(12) United States Patent
Do et al.

(10) Patent No.: US 7,968,996 B2
(45) Date of Patent: Jun. 28, 2011

(54) INTEGRATED CIRCUIT PACKAGE SYSTEM WITH SUPPORTED STACKED DIE

(75) Inventors: Byung Tai Do, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 15 days.

(21) Appl. No.: 12/565,698

(22) Filed: Sep. 23, 2009

(65) Prior Publication Data

US 2010/0001391 A1    Jan. 7, 2010

Related U.S. Application Data

(62) Division of application No. 11/463,505, filed on Aug. 9, 2006, now Pat. No. 7,618,848.

(51) Int. Cl.
*H01L 21/02* (2006.01)
(52) U.S. Cl. . 257/686; 257/690; 257/292; 257/E23.031; 257/E23.039; 257/E23.046
(58) Field of Classification Search ............... 257/666, 257/686, 690, 692, 723, 734, 735, E23.031, 257/E23.034, E23.046, E23.047; 438/109, 438/111, 112, 123
See application file for complete search history.

(56) References Cited

U.S. PATENT DOCUMENTS

| | | | |
|---|---|---|---|
| 5,612,570 A | 3/1997 | Eide et al. | |
| 5,780,925 A | 7/1998 | Cipolla et al. | |
| 6,307,257 B1 * | 10/2001 | Huang et al. | 257/676 |
| 6,353,265 B1 | 3/2002 | Michii | |
| 6,476,474 B1 * | 11/2002 | Hung | 257/686 |
| 6,605,875 B2 | 8/2003 | Eskildsen | |
| 6,753,206 B2 | 6/2004 | Huang et al. | |
| 7,049,687 B2 * | 5/2006 | Takahashi et al. | 257/673 |
| 7,071,543 B2 | 7/2006 | Ichikawa | |
| 7,843,046 B2 * | 11/2010 | Andrews et al. | 257/676 |
| 2005/0029645 A1 | 2/2005 | Mess et al. | |
| 2005/0104166 A1 * | 5/2005 | Ichikawa | 257/666 |
| 2005/0104170 A1 * | 5/2005 | Nakamura | 257/676 |
| 2005/0212144 A1 | 9/2005 | Rugg et al. | |
| 2005/0236698 A1 * | 10/2005 | Ozawa et al. | 257/666 |
| 2006/0214272 A1 | 9/2006 | Seki et al. | |
| 2007/0296086 A1 | 12/2007 | Ju et al. | |
| 2008/0036052 A1 | 2/2008 | Do et al. | |
| 2010/0144100 A1 * | 6/2010 | Espiritu et al. | 438/118 |

\* cited by examiner

*Primary Examiner* — Michael S Lebentritt
*Assistant Examiner* — Daniel Whalen
(74) *Attorney, Agent, or Firm* — Mikio Ishimaru (57) ABSTRACT

An integrated circuit package system provides a leadframe having a short lead finger, a long lead finger, and a support bar. A first die is placed in the leadframe. An adhesive is attached to the first die, the long lead finger, and the support bar. A second die is offset from the first die. The offset second die is attached to the adhesive. The first die is electrically connected to the short lead finger. The second die is electrically connected to at least the long lead finger or the short lead finger. At least portions of the leadframe, the first die, and the second die are encapsulated in an encapsulant.

10 Claims, 10 Drawing Sheets

INTEGRATED CIRCUIT PACKAGE SYSTEM WITH SUPPORTED STACKED DIE

CROSS-REFERENCE TO RELATED APPLICATION(S)

This is a divisional of U.S. patent application Ser. No. 11/463,505 filed Aug. 9, 2006.

The present application contains subject matter related to co-pending U.S. patent application Ser. No. 11/459,305 by Byung Tai Do and Heap Hoe Kuan entitled "Integrated Circuit Package System With Offset Stacked Die". The related application is assigned to STATS ChipPAC Ltd. The subject matter thereof is incorporated herein by reference thereto.

TECHNICAL FIELD

The present invention relates generally to semiconductor packages, and more particularly to a system for stacking semiconductor dies.

BACKGROUND ART

The computer industry continually strives toward higher performance, lower cost, increased miniaturization of components, and greater packaging density of integrated circuits ("IC's"). As new generations of IC products are released, their functionality increases while the number of components needed to produce them decreases.

Semiconductor devices are constructed from a silicon or gallium arsenide wafer through a process that comprises a number of deposition, masking, diffusion, etching, and implanting steps. Usually, many individual devices are constructed on the same wafer. When the devices are separated into individual rectangular units, each takes the form of an IC die. In order to interface a die with other circuitry, it is common to mount it on a leadframe or on a multi-chip module substrate that is surrounded by a number of lead fingers. Each die has bonding pads that are then individually connected in a wire-bonding operation to the leadframe's lead fingers using extremely fine gold or aluminum wires. The assemblies are then packaged by individually encapsulating them in molded plastic or ceramic bodies.

IC packaging technology has shown an increase in semiconductor chip density (the number of chips mounted on a single circuit board or substrate) that parallels the reduction in the number of components that are needed for a circuit. This results in packaging designs that are more compact, in form factors (the physical size and shape of a device) that are more compact, and in a significant increase in overall IC density. However, IC density continues to be limited by the space available for mounting individual dies on a substrate.

To further condense the packaging of individual devices, multi-chip packages have been developed in which more than one device (such as an IC die) can be included in the same package. Of importance to such complicated packaging designs are considerations of input/output lead count, heat dissipation, matching of thermal expansion and contraction between a motherboard and its attached components, costs of manufacturing, ease of integration into an automated manufacturing facility, package reliability, and easy adaptability of the package to additional packaging interfaces such as a printed circuit board ("PCB").

In some cases, multi-chip devices can be fabricated faster and more cheaply than a corresponding single IC die that incorporates the same features and functions. Some multi-chip modules consist of a PCB substrate onto which a set of separate IC chip components is directly attached. Other multi-chip modules mount and attach multiple dies on a single leadframe. Following assembly, the multi-chip modules are then encapsulated to prevent damage or contamination. Many such multi-chip modules have greatly increased circuit density and miniaturization, improved signal propagation speed, reduced overall device size and weight, improved performance, and lowered costs—all primary goals of the computer industry.

However, such multi-chip modules can be bulky. IC package density is determined by the area required to mount a die or module on a circuit board. One method to reduce the board size of multi-chip modules is to stack the dies or chips vertically within the module or package. This increases their effective density.

Two of the common die stacking methods are: (a) larger lower die combined with a smaller upper die, and (b) so-called same-size die stacking. With the former, the dies can be very close vertically since the electrical bond pads on the perimeter of the lower die extend beyond the edges of the smaller die on top. With same-size die stacking, the upper and lower dies are spaced more vertically apart to provide sufficient clearance for the wire bonds of the lower die. Then, once the dies are mounted, gold or aluminum bond wires are attached to connect the wire bonding pads on the upper die and on the lower die with the ends of their associated leadframe lead extensions.

Unfortunately, practices for same-size die stacking cause significant limitations in IC package density. Stacking arrangements must leave enough space between the upper die and the lower die for the wires. If the upper die is too close to the lower die, it can damage the lower die wires and cause short circuits. In order to prevent wire damage, some processes include supporting the upper die on separate pillars that hold the dies apart at a greater distance. Unfortunately, however, such pillars require extra components and extra assembly, which causes extra material costs, increases processing times, raises assembly costs, and increases overall product costs.

Thus, despite the advantages of recent developments in semiconductor fabrication and packaging techniques, there is a continuing need for improved packaging designs, systems, and methods to enable increased semiconductor die density in multi-chip same size die packages. In view of the need to increase package efficiency and capacity and to reduce package thicknesses, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system. A leadframe is provided having a short lead finger, a long lead finger, and a support bar. A first die is placed in the leadframe. An adhesive is attached to the first die, the long lead finger, and the support bar. A second die is offset from the first die. The offset second die is attached to the adhesive. The first die is electrically connected to the short lead finger. The second die is electrically connected to at least the long lead finger or the short lead finger. At least portions of the leadframe, the first die, and the second die are encapsulated in an encapsulant.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits and process steps are not disclosed in detail. Likewise, the drawings showing embodiments of the device are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation. In addition, where multiple embodiments are disclosed and described having some features in common, for clarity and ease of illustration, description, and comprehension thereof, like features one to another will ordinarily be described with like reference numerals.

For expository purposes, the term "horizontal" as used herein is defined as a plane parallel to the plane or surface of the leadframe, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Figure 1:
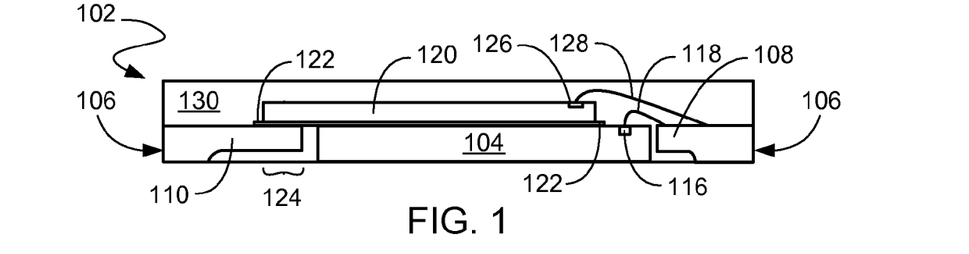
FIG. 1 is a cross sectional view of an integrated circuit package system according to an embodiment of the present invention.

Referring now to FIG. 1, therein is shown a cross sectional view of an integrated circuit package system 102 in accordance with an embodiment of the present invention. The integrated circuit package system 102 includes a first die 104 in a leadframe 106. The leadframe 106 has short lead fingers 108 and long lead fingers 110 on opposite sides of the first die 104. The short lead fingers 108 are shorter than the long lead fingers 110 and vice versa. In addition, the leadframe 106 has support bars 212 (See FIG. 2) with an interlock 214 (See FIG. 2). The first die 104 has first contact pads 116 that are aligned to the short lead fingers 108. The first contact pads 116 electrically connect to the short lead fingers 108 with first wires 118. An adhesive 122 is attached to the top of the first die 104 and the support bars 212. A second die 120 is attached to the top of the adhesive 122. The second die 120 is offset from the first die 104 and is the same size or nearly the same size as the first die 104. The second die 120 rests on a distal portion 124 of the long lead fingers 110 and does not cover the first contact pads 116. The second die 120 has second contact pads 126 that are aligned to the short lead fingers 108. The second contact pads 126 electrically connect to the short lead fingers 108 with second wires 128. An encapsulant 130 encapsulates portions of the first die 104, portions of the leadframe 106, the second die 120, the first wires 118, and the second wires 128.

Figure 2:
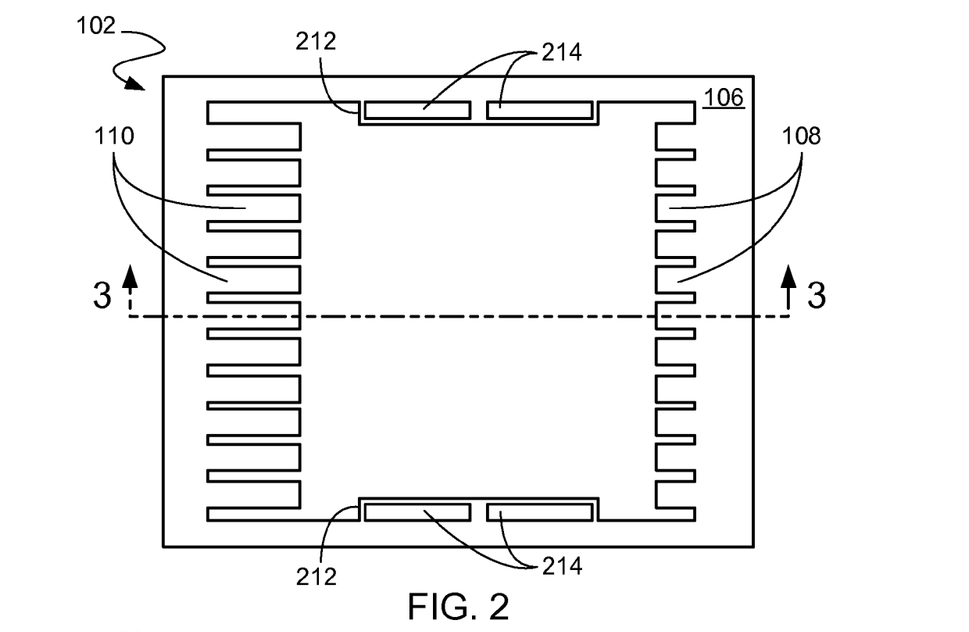
FIG. 2 is a plan view of the integrated circuit package system at an early stage of manufacture.

By resting the second die 120 on the distal portion 124 of the long lead fingers 110, the long lead fingers 110 provide support to the second die 120, allowing simultaneous wire bonding of the first die 104 and the second die 120. It has been unexpectedly discovered that when offsetting the second die 120 from the first die 104 and resting the second die 120 on the distal portion 124 of the long lead fingers 110, the adhesive 122 can be used with the support bars 212 and the interlock 214 to provide additional support during die attach and wire bonding. Thus by allowing simultaneous wire bonding through the use of supports, the integrated circuit package system 102 achieves increased manufacturing efficiency with fewer steps then systems using such processes. In addition, the interlock 214 enhances the adhesive strength between the encapsulant 130, the leadframe 106, and the adhesive 122, thus increasing the reliability of the integrated circuit package system 102.

Referring now to FIG. 2, therein is shown a plan view of the integrated circuit package system 102 in an early stage of manufacture. Processing has formed the leadframe 106. On opposite sides of the leadframe 106 are the long lead fingers 110 and the short lead fingers 108. In addition, the leadframe 106 has the support bars 212 with the interlocks 214 on sides of the leadframe 106 without the long lead fingers 110 or the short lead fingers 108.

Figure 3:
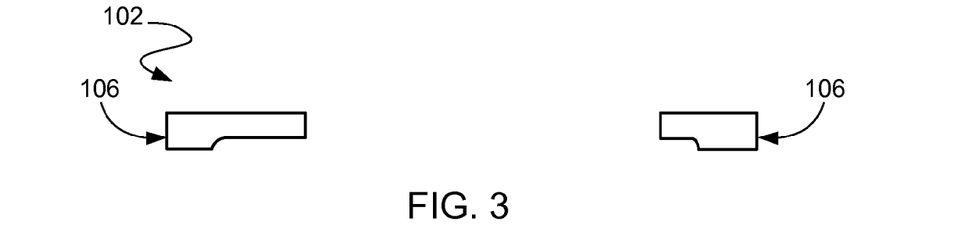
FIG. 3 is a cross sectional view of the structure shown in FIG. 2, taken along line 3-3 therein.

Referring now to FIG. 3, therein is shown a cross sectional view of the structure shown in FIG. 2, taken along line 3-3 therein.

Figure 4:
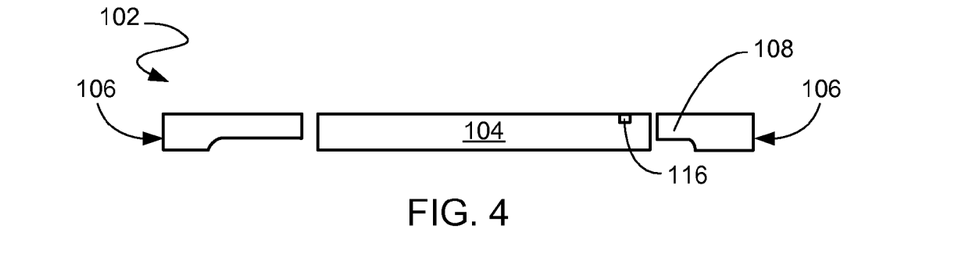
FIG. 4 is a view of the structure of FIG. 3 after placement of the first die.

Referring now to FIG. 4, therein is shown a view of the structure of FIG. 3, after further processing. The first die 104 has been placed within the leadframe 106 such that the first contact pads 116 are aligned with the short lead fingers 108.

Figure 5:
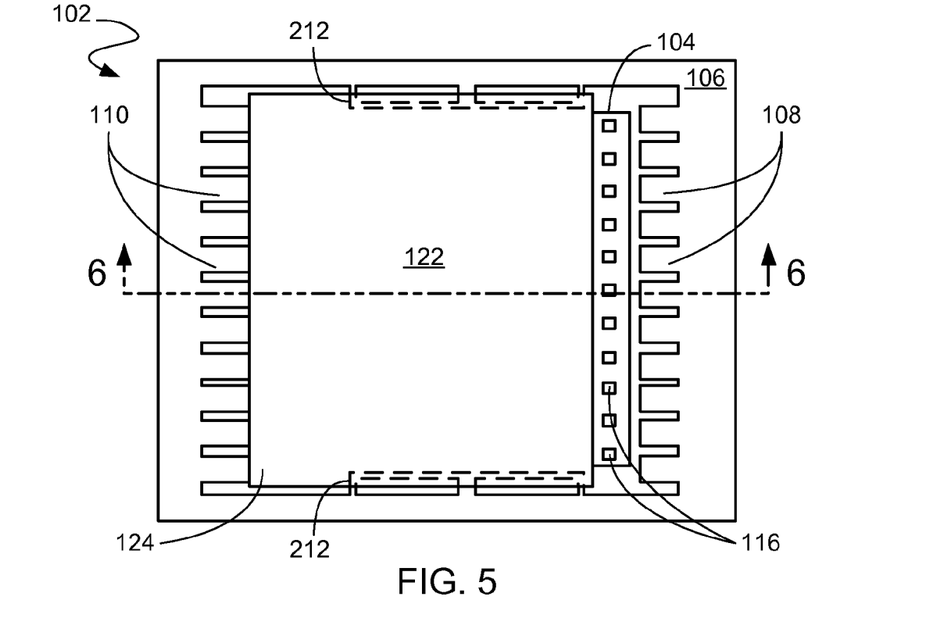
FIG. 5 is a view of the structure of FIG. 4 after attachment of the adhesive.

Referring now to FIG. 5, therein is shown a top view of the structure shown in FIG. 4, after further processing. The adhesive 122 is placed on the first die 104, the support bars 212, and the long lead fingers 110. The adhesive 122 does not entirely cover the first die 104, leaving the first contact pads 116 uncovered. In addition, the adhesive 122 does not entirely cover the long lead fingers 110, the support bars 212 or the interlocks 214.

Figure 6:
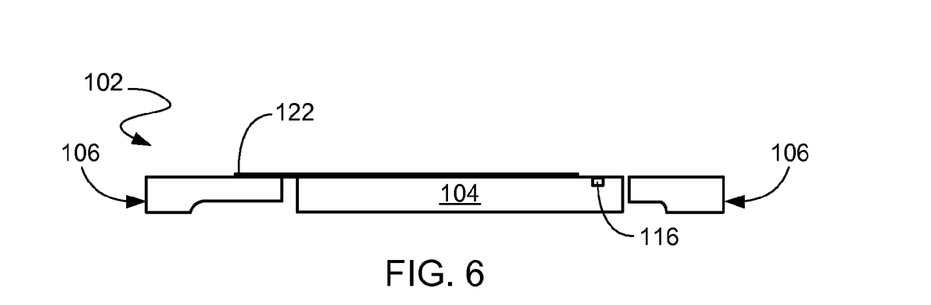
FIG. 6 is a cross sectional view of the structure shown in FIG. 5, taken along line 6-6 therein.

Referring now to FIG. 6, therein is shown a cross sectional view of the structure shown in FIG. 5, taken along line 6-6 therein.

Figure 7:
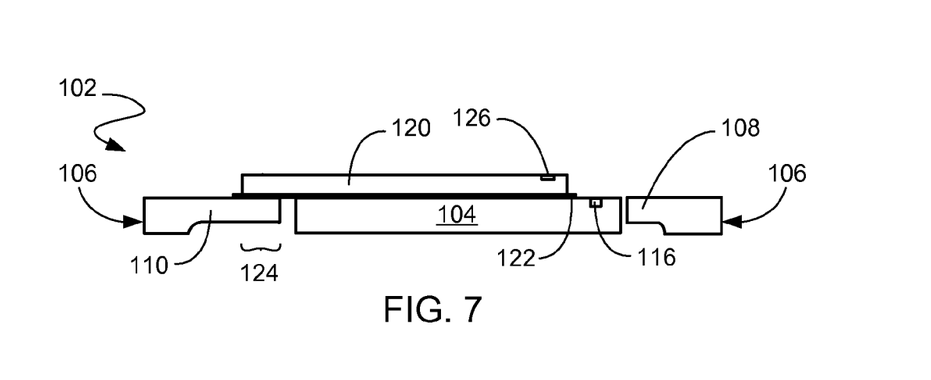
FIG. 7 is a view of the structure of FIG. 6 after attachment of the second die.

Referring now to FIG. 7, therein is shown a view of the structure of FIG. 6, after further processing. The adhesive 122 attaches the second die 120 to the top of the first die 104 and the distal portion 124 of the long lead fingers 110 such that the second contact pads 126 are aligned with the short lead fingers 108. In this embodiment, the second die 120 is substantially the same size as the first die 104 and is offset from the first die 104; however the second die 120 may be larger then the first die 104. The long lead fingers 110 and the adhesive 122 provide support for the second die 120. Furthermore, due to the offset of the second die 120 from the first die 104, the first contact pads 116 are left uncovered, thus allowing access for wire bonding.

Figure 8:
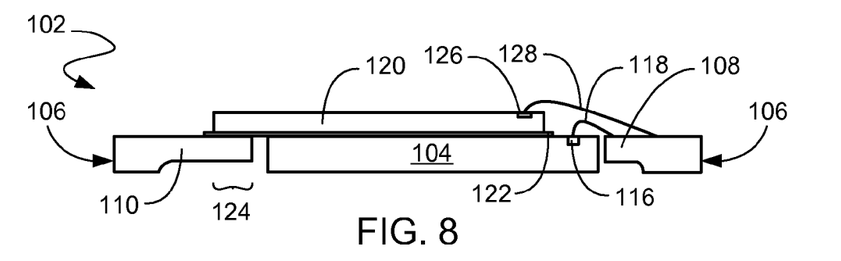
FIG. 8 is a view of the structure of FIG. 9, taken along line 8-8 therein.
Figure 9:
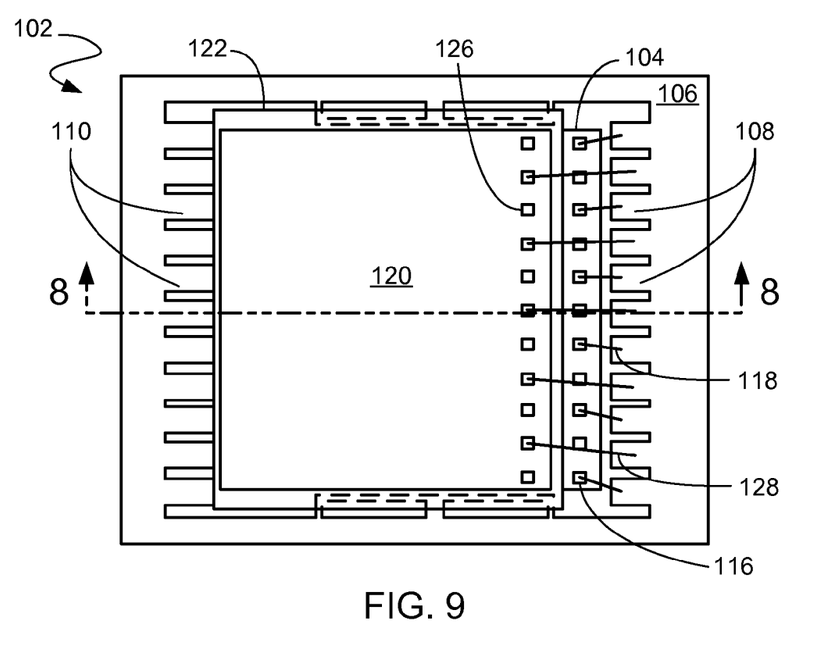
FIG. 9 is a plan view of the structure shown in FIG. 8.

Referring now to FIG. 8, therein is shown a cross sectional view of the structure shown in FIG. 9, taken along line 8-8 therein, after further processing. The first wires 118 electrically connect the first contact pads 116 on the first die 104 to the short lead fingers 108. In addition, the second wires 128 electrically connect the second contact pads 126 on the second die 120 to the short lead fingers 108.

Referring now to FIG. 9, therein is shown a plan view of the structure shown in FIG. 8. For clarity of illustration, only a few of the first wires 118 and the second wires 128 are shown.

Figure 10:
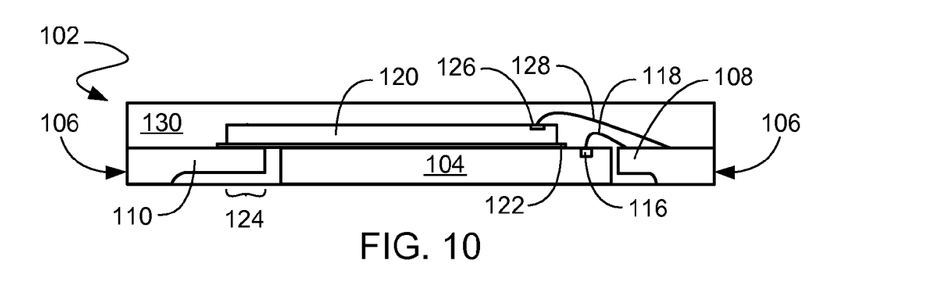
FIG. 10 is a view of the structure shown in FIG. 9 after encapsulation.

Referring now to FIG. 10, therein is shown a view of the structure shown in FIG. 9 after completed processing. The encapsulant 130 encapsulates portions of the first die 104, portions of the leadframe 106, the second die 120, the first wires 118, and the second wires 128. Thus, the bottom of the first die 104 and the bottoms of the long lead fingers 110 and the short lead fingers 108 are left exposed. These exposed portions aid in heat removal and electrical connections to larger systems.

Figure 11:
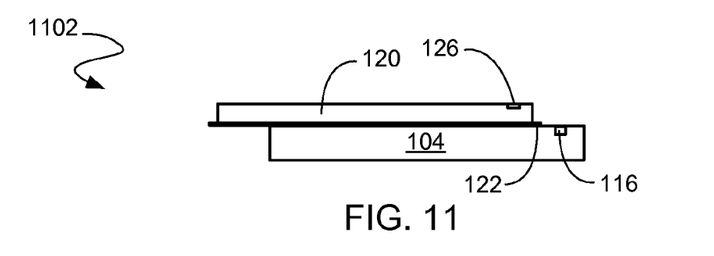
FIG. 11 is a cross sectional view of an integrated circuit package system according to an alternate embodiment of the present invention.

Referring now to FIG. 11, therein is shown a cross sectional view of an integrated circuit package system 1102 according to an alternate embodiment of the present invention. The integrated circuit package system 1102, shown in an initial stage of fabrication, includes a second die 120 attached to a first die 104 with an adhesive 122. The first die 104 has first contact pads 116 and the second die 120 has second contact pads 126.

Figure 12:
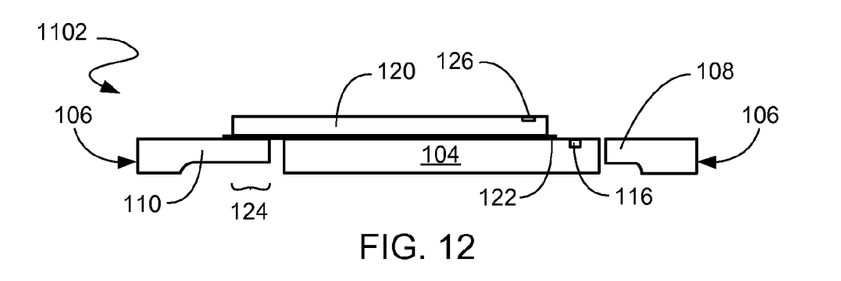
FIG. 12 is a view of the structure of FIG. 11 after placement in a leadframe.

Referring now to FIG. 12, therein is shown a view of the structure of FIG. 11 after further processing. The first die 104 and the second die 120 have been placed in a leadframe 106. The leadframe 106 has long lead fingers 110 and short lead fingers 108. In addition, the leadframe 106 has a support bar 212 (not shown, but see FIG. 2) with an interlock 214 (not shown, but see FIG. 2). The adhesive 122 attaches to the support bars 212 and attaches the second die 120 to a distal portion 124 of the long lead fingers 110.

Figure 13:
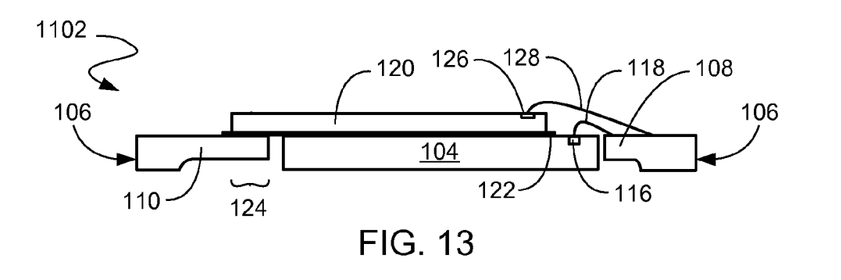
FIG. 13 is a view of the structure of FIG. 12 after wire bonding.

Referring now to FIG. 13, therein is shown a view of the structure of FIG. 12 after further processing. First wires 118 electrically connect the first contact pads 116 to the short lead fingers 108. In addition, second wires 128 electrically connect the second contact pads 126 to the short lead fingers 108.

Figure 14:
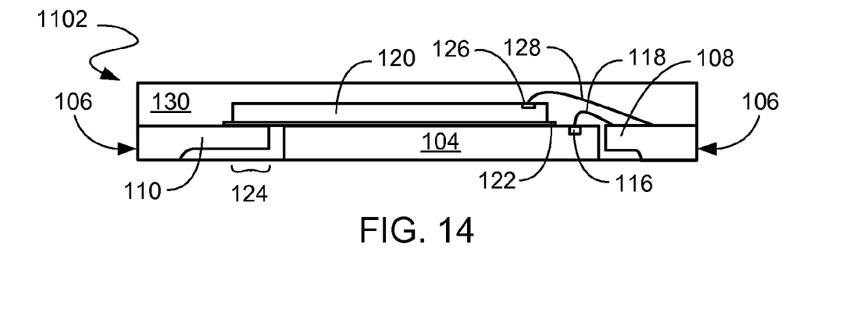
FIG. 14 is a view of the structure of FIG. 13 after encapsulation.
Figure 15:
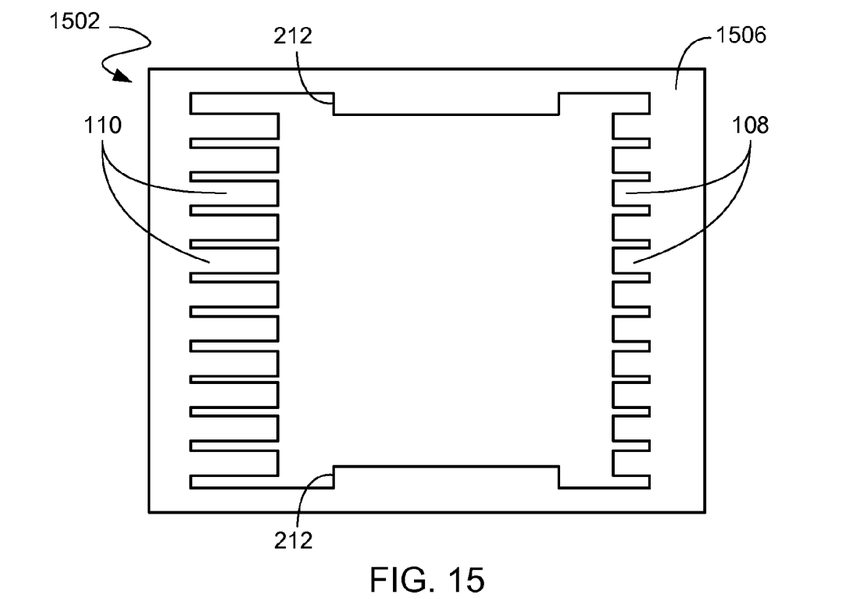
FIG. 15 is a plan view of an integrated circuit package system without interlocks according to an alternate embodiment of the present invention.

Referring now to FIG. 14, therein is shown a view of the structure of FIG. 15 after completed processing. The encapsulant 130 encapsulates portions of the first die 104, portions of the leadframe 106, the second die 120, the first wires 118, and the second wires 128. Thus, the bottom of the first die 104 and the bottoms of the long lead fingers 110 and the short lead fingers 108 are left exposed. These exposed portions aid in heat removal and electrical connections to larger systems.

Referring now to FIG. 15, therein is shown a plan view of an integrated circuit package system 1502, according to an alternate embodiment of the present invention. For clarity of illustration, only a leadframe 1506 is shown. The leadframe 1506 has long leads 110, short leads 108, and support bars 212. However, the support bars 212 are solid and do not have the interlocks 214 (See FIG. 2).

Figure 16:
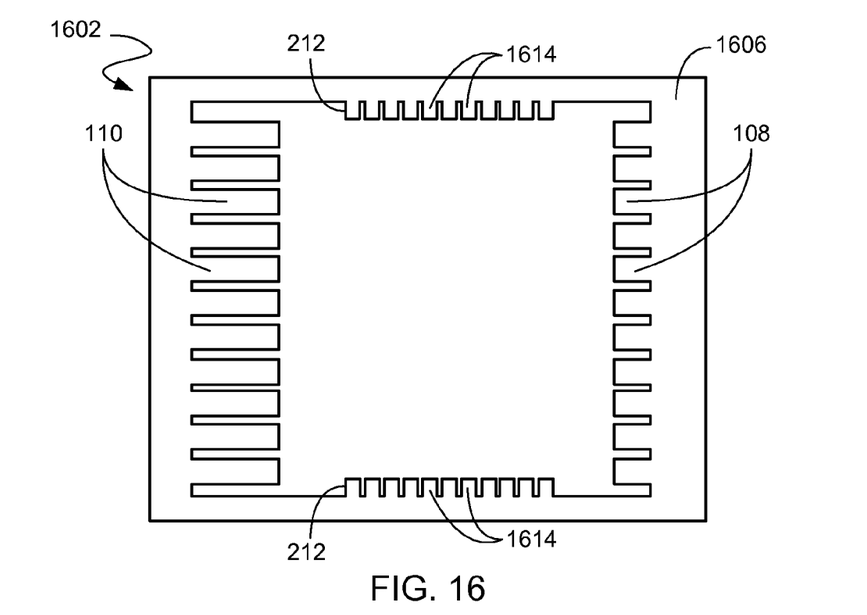
FIG. 16 is a plan view of an integrated circuit package system with dummy leads according to an alternate embodiment of the present invention.

Referring now to FIG. 16, therein is shown a plan view of an integrated circuit package system 1602, according to an alternate embodiment of the present invention. For clarity of illustration, only a leadframe 1606 is shown. The leadframe 1606 has long leads 110, short leads 108, and support bars 212. In this embodiment, the support bars 212 have dummy leads 1614 that are used instead of the interlocks 214 (See FIG. 2).

Figure 17:
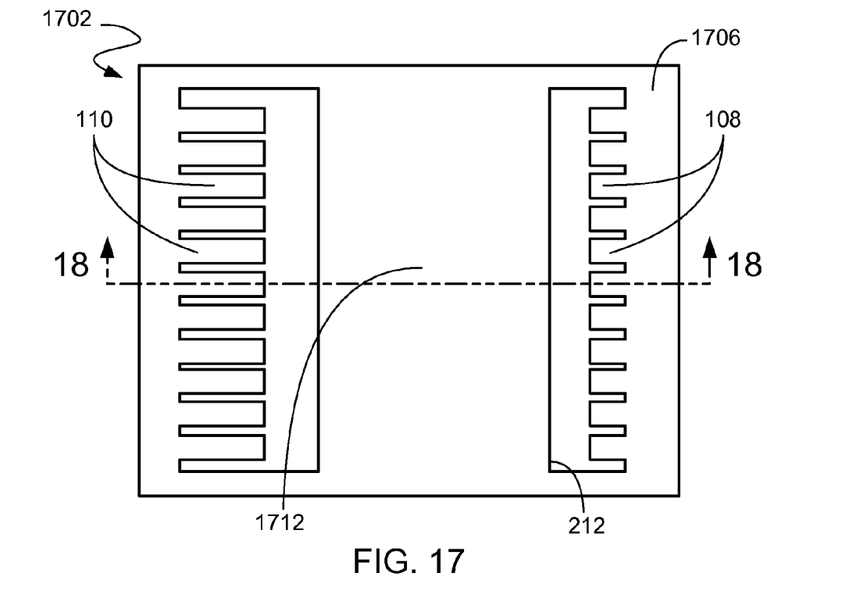
FIG. 17 is a plan view of an integrated circuit package system with a paddle according to an alternate embodiment of the present invention.

Referring now to FIG. 17, therein is shown a plan view of an integrated circuit package system 1702, according to an alternate embodiment of the present invention. For clarity of illustration, only a leadframe 1706 is shown. The leadframe 1706 has long leads 110, short leads 108, and a support bar 212. In this embodiment, the support bar 212 has a paddle 1712 that is used instead of the interlocks 214 (See FIG. 2).

Figure 18:
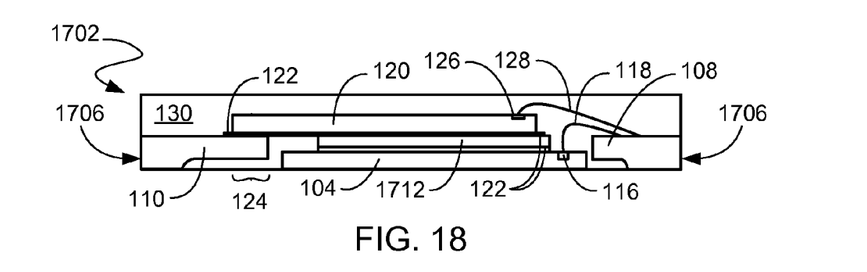
FIG. 18 is a cross sectional view of the structure shown in FIG. 17, taken along line 18-18 therein.

Referring now to FIG. 18, therein is shown a cross sectional view of the structure of FIG. 17, taken along line 18-18 therein. In this embodiment, an adhesive 122 attaches a first die 104 and a second die 120 to the paddle 1712. The first die 104 is attached to the bottom of the paddle 1712 and the second die 120 is attached to the top of the paddle 1712.

Figure 19:
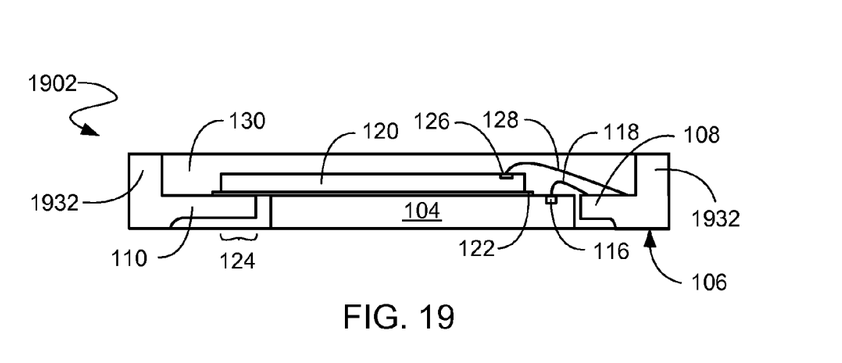
FIG. 19 is a cross sectional view of a supported integrated circuit package system according to an alternate embodiment of the present invention.

Referring now to FIG. 19, therein is shown a cross sectional view of a supported integrated circuit package system 1902 according to an alternate embodiment of the present invention. The supported integrated circuit package system 1902 includes a first die 104 in a leadframe 106. The leadframe 106 has short lead fingers 108 and long lead fingers 110 on opposite sides of the first die 104 and support bars 212 (not shown, but see FIG. 2) with an interlock 214 (not shown, but see FIG. 2). In addition, the leadframe 106 has supports 1932 on the ends of the short lead fingers 108 and the long lead fingers 110, opposite the first die 104. The first die 104 has first contact pads 116 that electrically connect to the short lead fingers 108 with first wires 118. A second die 120 is attached to the top of the first die 104 and the long lead fingers 110 with an adhesive 122. The second die 120 is offset from the first die 104 and is the same size or nearly the same size as the first die 104, however the second die 120 may be larger then the first die 104. The second die 120 rests on a distal portion 124 of the long lead fingers 110 and does not cover the first contact pads 116. The second die 120 has second contact pads 126 that electrically connect to the short lead fingers 108 with second wires 128. An encapsulant 130 encapsulates portions of the first die 104, portions of the leadframe 106, the second die 120, the first wires 118, and the second wires 128.

The supported integrated circuit package system 1902 has the advantages of the integrated circuit package system 102 (FIG. 1). In addition, the supports 1932 allow multiple supported integrated circuit package systems 1902 to be stacked (see FIG. 22).

Figure 20:
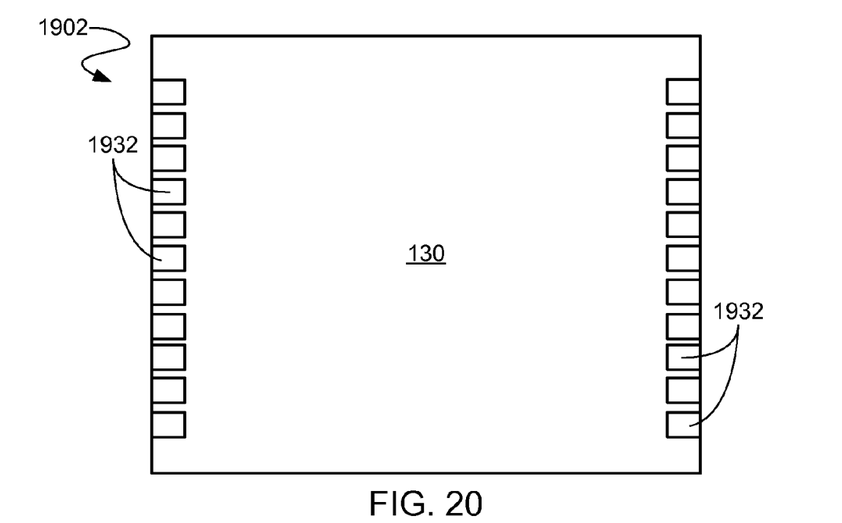
FIG. 20 is a top view of the supported integrated circuit package system.

Referring now to FIG. 20, therein is shown a top view of the supported integrated circuit package system 1902.

Figure 21:
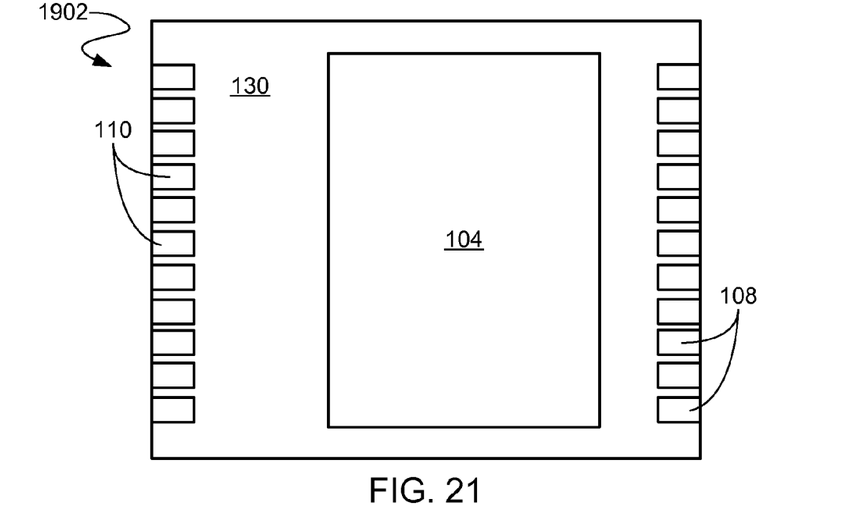
FIG. 21 is a bottom view of the supported integrated circuit package system.

Referring now to FIG. 21, therein is shown a bottom view of the supported integrated circuit package system 1902.

Figure 22:
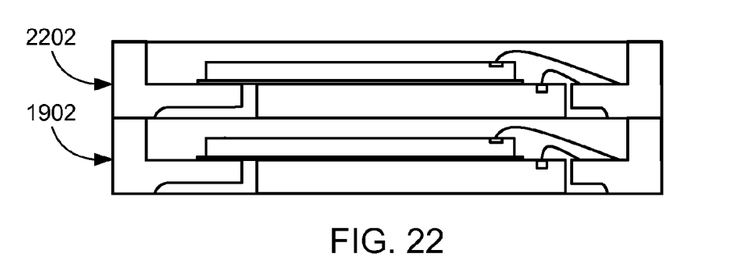
FIG. 22 is a cross sectional view of supported integrated circuit package systems stacked on one another.

Referring now to FIG. 22, therein is shown a cross sectional view of supported integrated circuit package system 1902 and a second supported integrated circuit package system 2202 stacked on one another.

Figure 23:
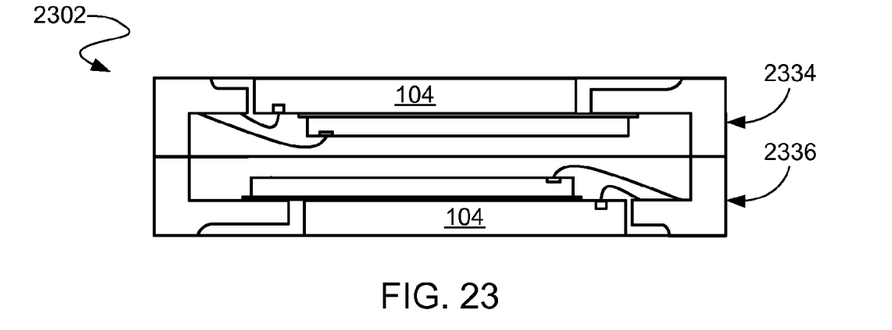
FIG. 23 is a cross sectional view of an inverted stacked integrated circuit package system according to an alternate embodiment of the present invention.

Referring now to FIG. 23, therein is shown a cross sectional view of an inverted stacked integrated circuit package system 2302 according to an alternate embodiment of the present invention. In this embodiment, a top supported integrated circuit package system 2334 is inverted and placed on a bottom supported integrated circuit package system 2336. Thus, the first dies 104 are left exposed, improving heat removal.

Figure 24:
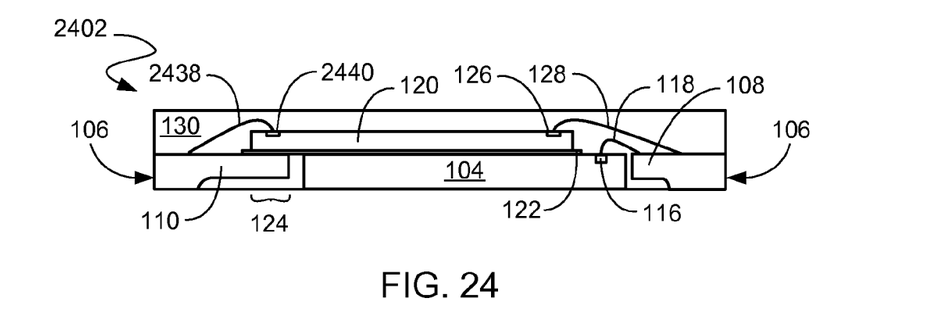
FIG. 24 is a cross sectional view of an integrated circuit package system with third contact pads according to an alternate embodiment of the present invention.

Referring now to FIG. 24, therein is shown a cross sectional view of an integrated circuit package system 2402 according to an alternate embodiment of the present invention. The integrated circuit package system 2402 is the same as the integrated circuit package system 102 (FIG. 1) with the addition of third contact pads 2440 on the second die 120. The third contact pads 2440 are located on the same side of the second die 120 as the long lead fingers 110. Third wires 2438 electrically connect the third contact pads 2440 to the long lead fingers 110.

Figure 25:
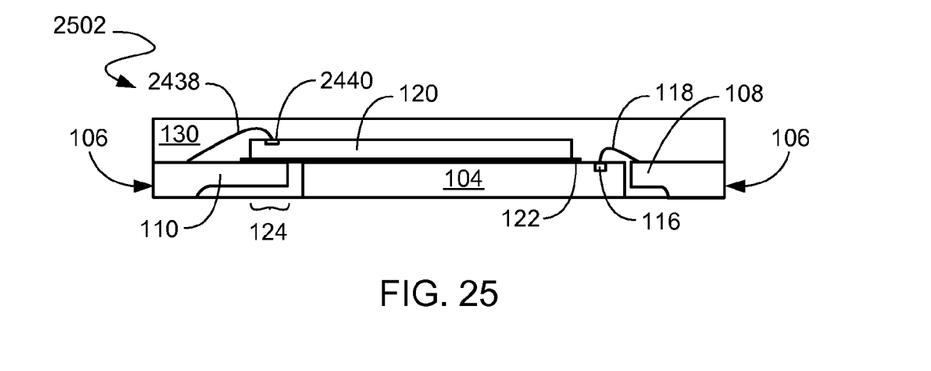
FIG. 25 is a cross sectional view of an integrated circuit package system according to an alternate embodiment of the present invention.

Referring now to FIG. 25, therein is shown a cross sectional view of an integrated circuit package system 2502 according to an alternate embodiment of the present invention. The integrated circuit package system 2502 is the same as the integrated circuit package system 2402 (FIG. 24) except that there are only the first contact pads 116 and the third contact pads 2440.

Figure 26:
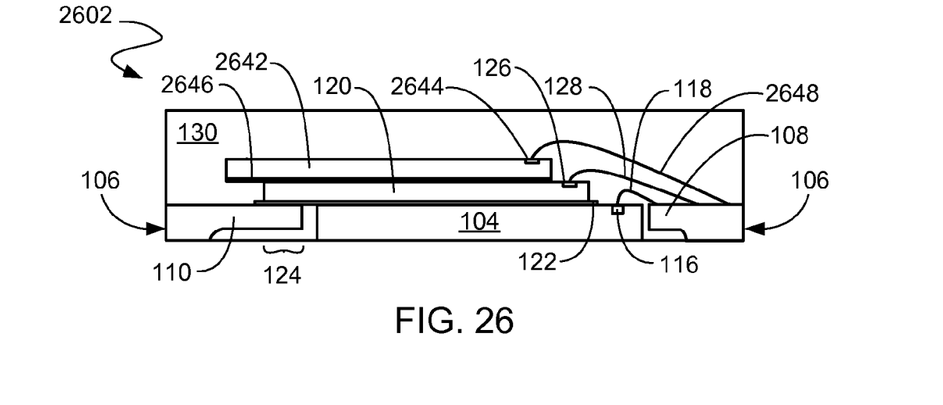
FIG. 26 is a cross sectional view of an integrated circuit package system with a third die according to an alternate embodiment of the present invention.

Referring now to FIG. 26, therein is shown a cross sectional view of an integrated circuit package system 2602 according to an alternate embodiment of the present invention. The integrated circuit package system 2602 is the same as the integrated circuit package system 102 (FIG. 1) with the addition of a third die 2642 on the second die 120. The third die 2642 is attached to the top of the second die 120 with a second adhesive 2646. Third wires 2648 electrically connect third contact pads 2644 on the third die 2642 to the short lead fingers 108.

Figure 27:
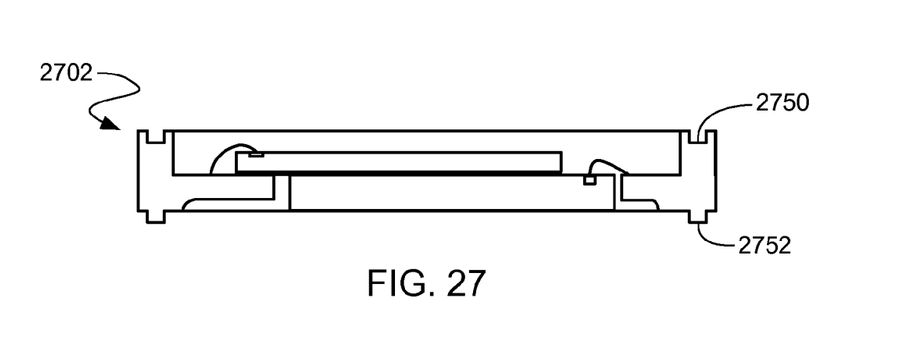
FIG. 27 is a cross sectional view of a supported integrated circuit package system with alignment slots and alignment posts according to an alternate embodiment of the present invention.

Referring now to FIG. 27, therein is shown a cross sectional view of a notched integrated circuit package system 2702 according to an alternate embodiment of the present invention. The notched integrated circuit package system 2702 is the same as the supported integrated circuit package system 1902 (FIG. 19) with the addition of alignment slots 2750 and alignment posts 2752. The alignment slots 2750 and the alignment posts 2752 assist aligning of multiple notched integrated circuit package systems 2702 during package stacking (see FIG. 28).

Figure 28:
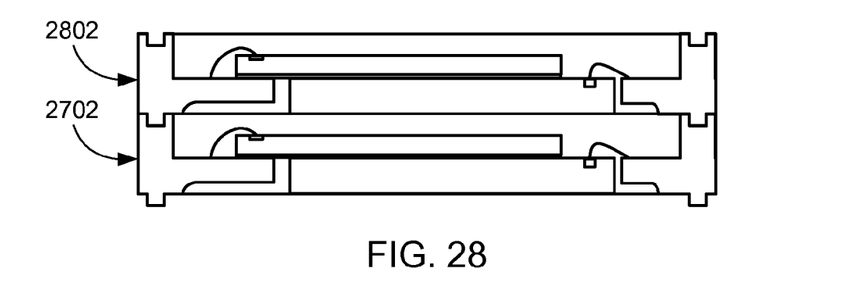
FIG. 28 is a cross sectional view of supported integrated circuit package systems with alignment slots and alignment posts stacked on one another.

Referring now to FIG. 28, therein is shown a cross sectional view of the notched integrated circuit package system 2702 and a second notched integrated circuit package system 2802 stacked on one another by the alignment slots 2750 (FIG. 27) and the alignment posts 2752 (FIG. 27).

Figure 29:
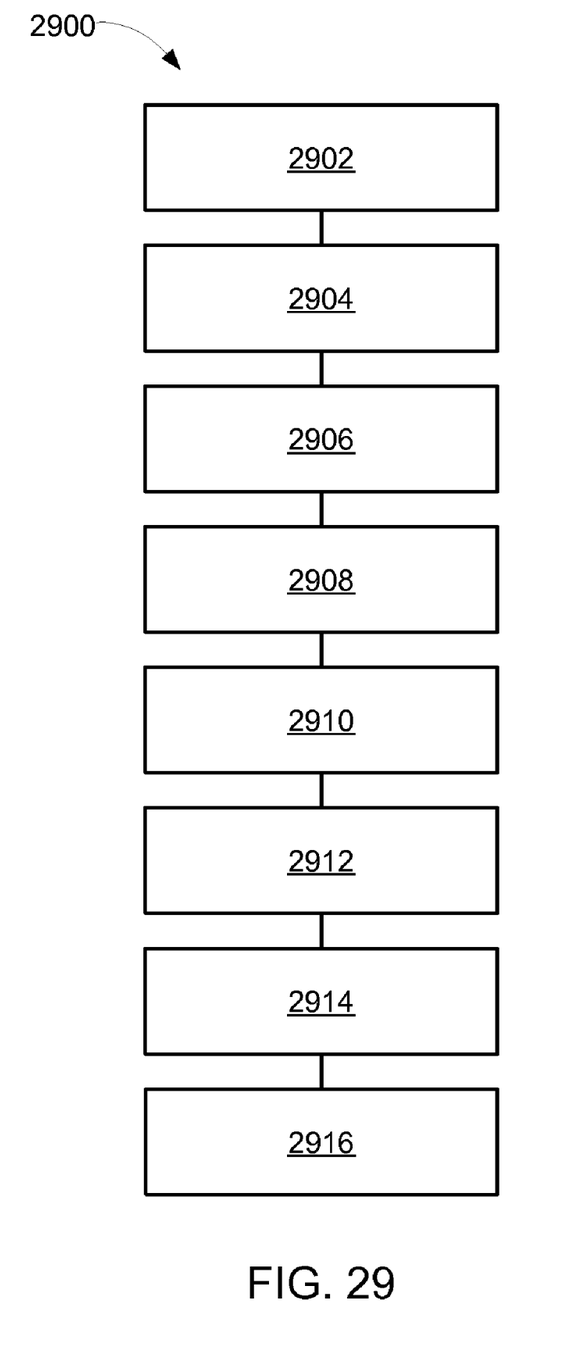
FIG. 29 is a flow chart of a system for an integrated circuit package system in accordance with an embodiment of the present invention.

Referring now to FIG. 29, therein is shown a flow chart of an integrated circuit package system 2900 in accordance with an embodiment of the present invention. The integrated circuit package system 2900 includes providing a leadframe having a short lead finger, a long lead finger, and a support bar in a block 2902; placing a first die in the leadframe in a block 2904; attaching an adhesive to the first die, the long lead finger, and the support bar in a block 2906; offsetting a second die from the first die in a block 2908; attaching the offset second die to the adhesive in a block 2910; electrically connecting the first die to the short lead finger in a block 2912; electrically connecting the second die to at least the long lead finger or the short lead finger in a block 2914; and encapsulating at least portions of the leadframe, the first die, and the second die in an encapsulant in a block 2916.

Thus, it has been discovered that the integrated circuit package system of the present invention furnishes important and heretofore unknown and unavailable solutions, capabilities, and functional advantages for reducing the size and increasing the efficiency in integrated circuit package systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system, comprising:
    a leadframe having a short lead finger, a long lead finger, and a support bar;

a first die in the leadframe and electrically connected to the short lead finger;
a second die offset from the first die and electrically connected to at least the long lead finger or the short lead finger;
an adhesive attached to the second die, the first die, the long lead finger, and the support bar; and
an encapsulant encapsulating at least portions of the leadframe, the first die, and the second die.

2. The system of claim 1 wherein:
the leadframe further comprises supports forming a supported package; and
further comprising:
a second supported package stacked on the supported package.

3. The system of claim 1 wherein:
the leadframe further comprises supports forming a supported package; and
further comprising:
a second supported package that is inverted and stacked on the supported package.

4. The system of claim 1 wherein the support bar comprises an interlock, a dummy lead, or a paddle.

5. The system of claim 1 further comprising:
a first wire electrically connecting the first die to the short lead finger;
a second wire electrically connecting the second die to the short lead finger; and
a third wire electrically connecting the second die to the long lead finger.

6. The system of claim 1 further comprising:
a first contact pad on the first die aligned to the short lead finger;
a second contact pad on the second die aligned to the short lead finger;
a first wire electrically connecting the first contact pad to the short lead finger;
a second wire electrically connecting the second contact pad to the short lead finger; and
wherein:
the short lead finger and the long lead finger are on opposite sides of the leadframe; and
the second die leaves the first contact pad uncovered.

7. The system of claim 6 wherein:
the leadframe further comprises alignment slots and alignment posts on the short lead finger and the long lead finger to form a notched package; and
further comprising:
a second notched package aligned with and stacked on the notched package by the alignment slots and the alignment posts.

8. The system of claim 6 wherein:
the leadframe further comprises supports forming a supported package; and
further comprising:
a second supported package that is inverted and stacked on the supported package.

9. The system of claim 6 wherein the support bar comprises an interlock, a dummy lead, or a paddle.

10. The system of claim 6 further comprising:
a third die;
a second adhesive attaching the third die to the second die; and
a third wire electrically connecting the third die to the short lead finger.

* * * * *